United States Patent
Spaeth et al.

[11] Patent Number: 5,981,945
[45] Date of Patent: *Nov. 9, 1999

[54] OPTOELECTRONIC TRANSDUCER FORMED OF A SEMICONDUCTOR COMPONENT AND A LENS SYSTEM

[75] Inventors: Werner Spaeth, Holzkirchen; Wolfgang Gramann; Georg Bogner, both of Regensburg; Ralf Dietrich, München, all of Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/614,836

[22] Filed: Mar. 8, 1996

[30] Foreign Application Priority Data

Mar. 8, 1995 [DE] Germany ............... 195 08 222

[51] Int. Cl.$^6$ ..................................... H01J 5/02
[52] U.S. Cl. ................. 250/239; 250/216; 257/81
[58] Field of Search .................. 250/239, 216, 250/214.1, 214 R; 257/81, 433, 82–84, 431, 432, 436, 99, 100

[56] References Cited

U.S. PATENT DOCUMENTS

| | | | |
|---|---|---|---|
| 4,055,761 | 10/1977 | Shimomura | 250/239 |
| 4,403,243 | 9/1983 | Hakamada | 257/433 |
| 4,993,799 | 2/1991 | Stein | 257/432 |
| 5,087,964 | 2/1992 | Hatta | 257/432 |
| 5,167,724 | 12/1992 | Chiang et al. | 136/246 |
| 5,274,456 | 12/1993 | Izumi et al. | 358/209 |
| 5,617,131 | 4/1997 | Murano et al. | 250/208.1 |

FOREIGN PATENT DOCUMENTS

| | | |
|---|---|---|
| 0 094 598 | 11/1983 | European Pat. Off. . |
| 29 00 356 A1 | 7/1979 | Germany . |
| 6326831 | 11/1994 | Japan . |

OTHER PUBLICATIONS

Patents Abstracts of Japan, E–1077, Jun. 14, 1991, vol. 15, No. 233: and JP–3–69169 (NEC).

Patents Abstracts of Japan, E–1471, Dec. 7, 1993, vol. 17, No. 661: and JP–5–218463 (Sumitomo).

*Primary Examiner*—Que T. Le
*Attorney, Agent, or Firm*—Herbert L. Lerner; Laurence A. Greenberg

[57] ABSTRACT

An optoelectronic transducer includes a base plate, a radiation-emitting or transmitting semiconductor component disposed on the base plate, an optical lens system aimed at the semiconductor component and a spacer joined to the base plate for the lens system. The base plate, the spacer and the lens system are formed of materials with at least similar coefficients of thermal expansion. A method for producing an optoelectronic transducer includes forming indentations in a base plate for receiving semiconductor components, while leaving a land remaining on at least one side of each of the indentations. A first plate of the size of the base plate is placed on the lands and joined to the lands by material locking. The first plate is removed between the lands producing spacers joined to the base plate. A number of the semiconductor components are inserted into the indentations in accordance with a predetermined grid pattern and are joined to the base plate to form substrates. The substrates are covered with a second plate including a number of lens systems correspopnding to number of semiconductor components, while placing the lens systems of the second plate in the same grid pattern. The second plate is adjusted relative to the substrates for aiming each of the lens systems at a respective one of the semiconductor components. The second plate is secured to the substrates.

17 Claims, 3 Drawing Sheets

OPTOELECTRONIC TRANSDUCER FORMED OF A SEMICONDUCTOR COMPONENT AND A LENS SYSTEM

BACKGROUND OF THE INVENTION

1. Field of the Invention

The invention relates to an optoelectronic transducer having a radiation-emitting or transmitting semiconductor component with a base plate on which the semiconductor component is secured, and a spacer joined to the base plate for an optical lens system aimed at the semiconductor component. The invention also relates to a method for producing the optoelectronic transducer.

Such transducers are known, for instance, from U.S. Pat. No. 4,055,761 or Japanese Patent Disclosure JP 5-218 463. Operating the transducers with good efficiency presents a considerable problem. Aside from the properties of the semiconductor component itself, the efficiency is optimally achieved by aiming the lens system optically at the semiconductor component. It is only then that the light from the semiconductor component can be outcoupled at high efficiency to an optical wave guide or coupled into the semiconductor component from an optical wave guide.

In an optoelectronic transducer, it must moreover be assured that the optimal adjustment is preserved even during operation. That is, when the transducer heats up during operation misadjustments can occur that worsen the efficiency.

SUMMARY OF THE INVENTION

It is accordingly an object of the invention to provide an optoelectronic transducer and a production method, which overcome the hereinafore-mentioned disadvantages of the heretofore-known devices and methods of this general type, in which temperature fluctuations have only a slight influence on an adjustment between a semiconductor component and a lens system and in which the method for producing the optoelectronic transducer is simple.

With the foregoing and other objects in view there is provided, in accordance with the invention, an optoelectronic transducer, comprising a base plate; a radiation-emitting or transmitting semiconductor component disposed on the base plate; an optical lens system aimed at the semiconductor component; and a spacer joined to the base plate for the lens system; the base plate, the spacer and the lens system being formed of materials with at least similar coefficients of thermal expansion.

In accordance with another feature of the invention, the base plate and the lens system are formed of silicon and the spacer is formed of glass.

In accordance with a further feature of the invention, the base plate is formed of glass and the lens system and the spacer are formed of silicon.

In accordance with an added feature of the invention, the base plate has a metal layer on which the semiconductor component is secured.

In accordance with an additional feature of the invention, the spacer formed of glass is joined to the base plate and the lens system formed of silicon, by anodic bonding.

In accordance with yet another feature of the invention, the base plate formed of glass is joined to the lens system and the spacer formed of silicon, by anodic bonding.

In accordance with yet a further feature of the invention, the spacer formed of glass is joined to the base plate and the lens system formed of silicon by soldering or adhesive bonding.

In accordance with yet an added feature of the invention, the base plate formed of glass is joined to the lens system and the spacer formed of silicon by soldering or adhesive bonding.

In accordance with yet an additional feature of the invention, the semiconductor component is seated in an indentation fomred in the base plate.

In accordance with again another feature of the invention, there is provided a glass plate, the base plate being formed of silicon and having a side remote from the semiconductor component being joined to the glass plate.

With the objects of the invention view there is also provided, in accordance with the invention, a method for producing an optoelectronic transducer, which comprises forming indentations in a base plate for receiving semiconductor components, while leaving a land remaining on at least one side of each of the indentations; placing a first plate of the size of the base plate on the lands and joining the first plate to the lands by material locking; removing the first plate between the lands producing spacers joined to the base plate; inserting a number of the semiconductor components into the indentations in accordance with a predetermined grid pattern and joining the semiconductor components to the base plate to form substrates; covering the substrates with a second plate including a number of lens systems corresponding to number of semiconductor components, while placing the lens systems of the second plate in the same grid pattern; adjusting the second plate relative to the substrates for aiming each of the lens systems at a respective one of the semiconductor components; securing the second plate to the substrates; and cutting apart a composite including the base plate, the semiconductor components, the spacers and the second plate by making first parallel cuts and second cuts perpendicular to first cuts forming units each containing one base plate, one semiconductor component, spacers and one lens system.

In accordance with a concomitant mode of the invention, there is provided a method which comprises inserting each of the units into a gas-tight housing.

Other features which are considered as characteristic for the invention are set forth in the appended claims.

Although the invention is illustrated and described herein as embodied in an optoelectronic transducer and a production method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
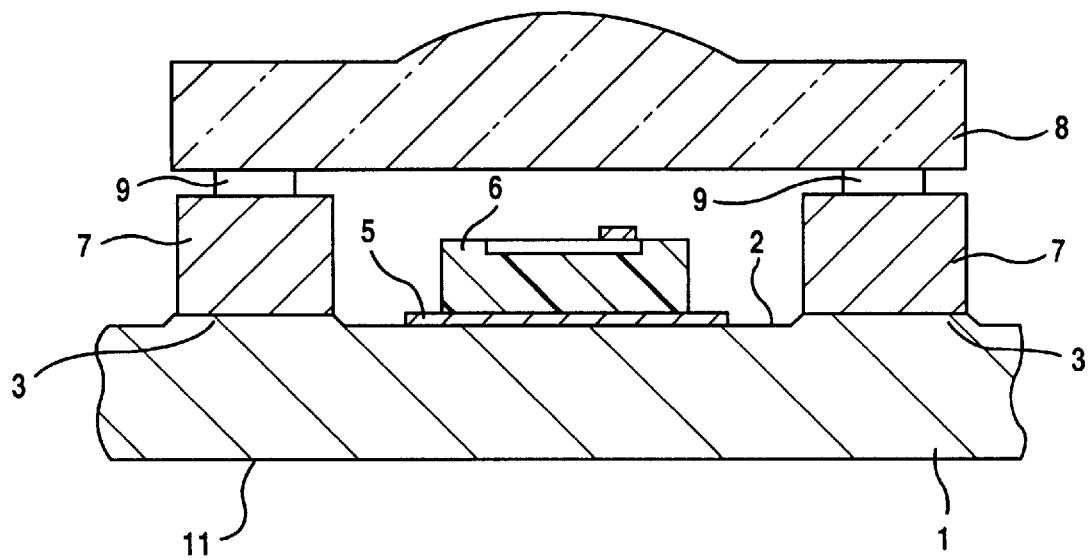
FIG. 1 is a fragmentary, diagrammatic, longitudinal-sectional view of a first exemplary embodiment of the invention.

Referring now to the figures of the drawings in detail and first, particularly, to FIG. 1 thereof, there is seen an optoelectronic transducer 11 which is built up on a base plate 1. An upper surface of the base plate 1 is provided with indentations 2. Ridges or lands 3 remain on both sides of the indentation 2. A radiation-emitting or radiation-transmitting semiconductor component 6 is secured in the indentation 2, through a metallizing 5. This element may, for instance, be a photo diode, a light emitting diode (LED) or a vertical cavity surface emitter laser (VCSEL). The metallizing 5 also serves to supply current to the semiconductor component 6. A second contact is located on an upper surface of the semiconductor component.

Spacers 7 which, for instance, are likewise ridge-shaped or land-shaped, are secured on the lands 3. A lens system 8, which is joined materially to the spacers, is located on the spacers 7. A spacing between the lens system and a bottom of the indentation 2 is greater than the thickness of the semiconductor component 6 minus the metal layer 5.

The base plate 1 is formed of silicon. However, it may be polycrystalline or monocrystalline. Instead of silicon some other material with a suitable coefficient of thermal expansion can be used for the base plate 1.

The spacers 7 are formed of glass, while the lens system may be formed of silicon or glass. What is essential is that at least one part made of glass be disposed between the semiconductor component and the lens system. The low thermal conductivity of the glass part prevents heat, which is diverted from the semiconductor component 6 into the base plate 1, from reaching the lens system. Due to its good thermal conductivity, a silicon base plate is preferably used for radiation-emitting semiconductor components, since in this case the output being converted, among other things, is greater than in radiation receivers. In radiation receivers, the base plate 1 may be formed of glass, the spacers 7 of silicon, and the lens system 8 of silicon or glass. In both cases, the use of silicon for the lens system is preferred whenever the radiation has a wave length for which silicon is permeable. This is true for wavelengths greater than 1.1 $\mu$m.

The base plate, the spacers 7 and the lens system 8 can be joined together by adhesive bonding and/or soldering. If silicon surfaces and glass surfaces contact one another, then they can also be joined together by anodic bonding. That is a known technique. The parts to be bonded together are pressed together at a temperature of 400° C., for instance, and a voltage of −1000 V, for instance, is applied to the glass. Since that joining technique is highly replicable, it is recommended, in the case where the base plate 1 and the lens system 8 are formed of glass, that the spacers 7 also be made of silicon. When the spacers and the lens system are soldered or adhesively bonded, a solder or adhesive layer 9 is inserted between the two parts. A solder layer can be applied by spluttering, for instance.

A type of glass that has a coefficient of thermal expansion similar to silicon is used as the glass in this case. One suitable example is a borosilicate glass that is available on the market under the trademark PYREX 7740 by the firm Corning or the trademark TEMPAX by the firm Schott.

If the optoelectronic transducer 11 is to have a low capacitance, then a glass base plate is recommended instead of a silicon base plate. However, if for the sake of better heat dissipation a silicon base plate is required, then this base plate can be made thin and can be joined on its back side to a glass plate 10 seen in FIG. 2. The glass plate 10 can be joined to the silicon base plate either by anodic bonding, by soldering or by adhesive bonding.

Figure 2:
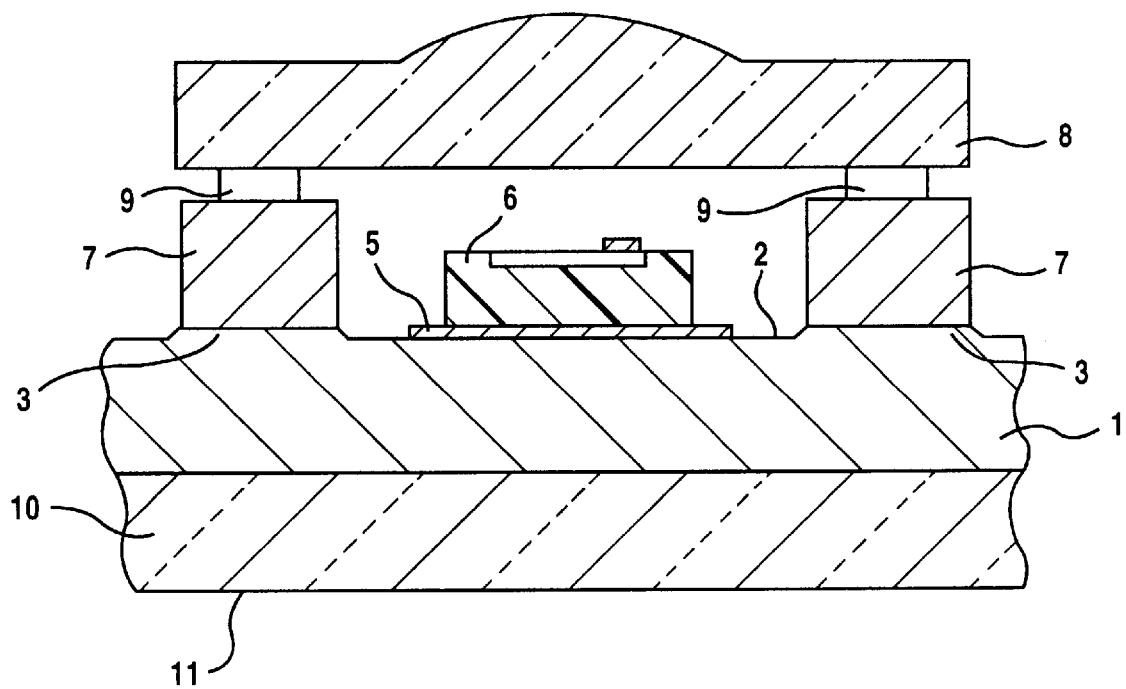
FIG. 2 is a view similar to FIG. 1 of a second exemplary embodiment of the invention.
Figure 5:
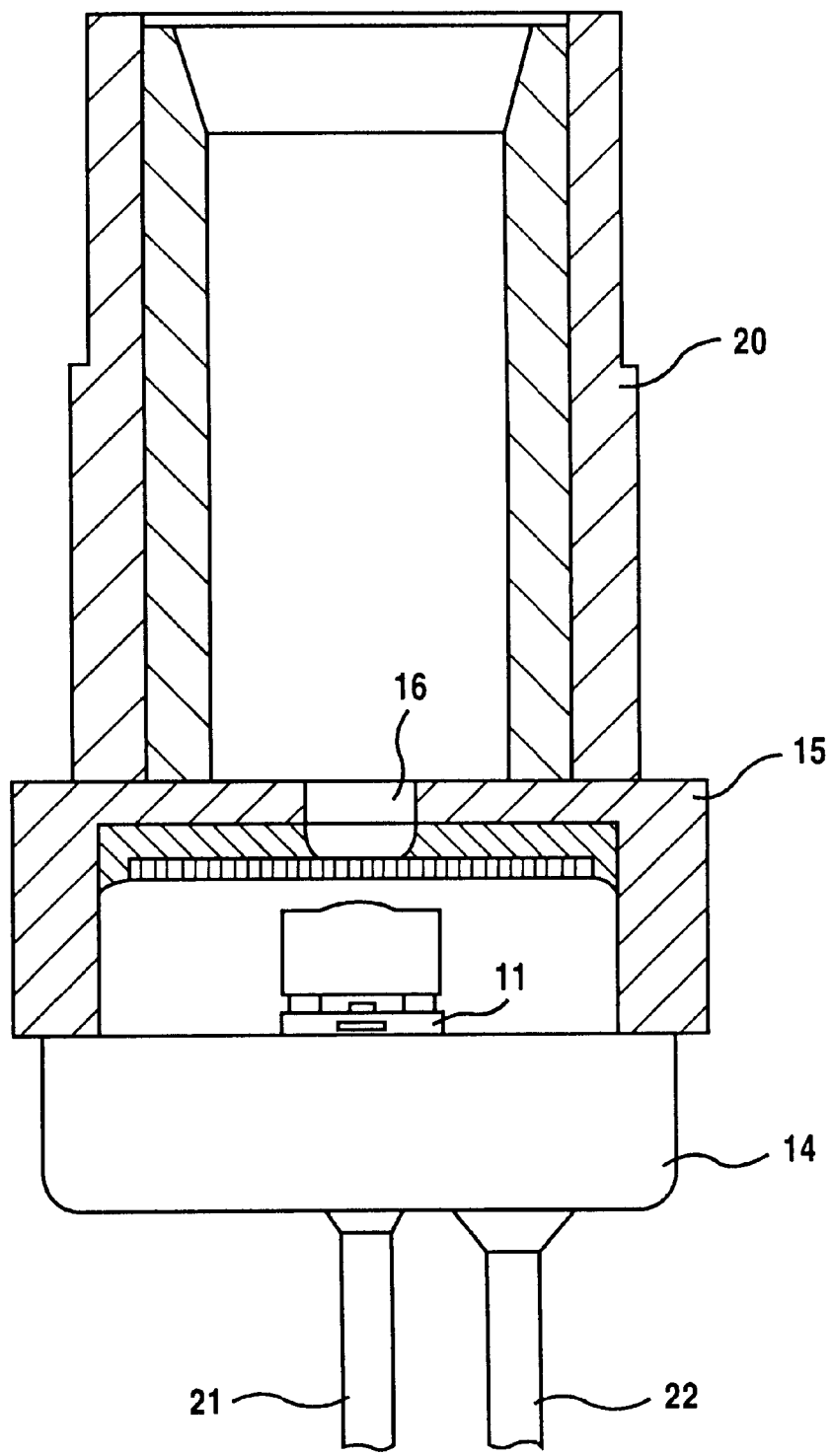
FIG. 5 is a fragmentary, longitudinal-sectional view of a housing with a transducer inserted.

The transducers 11 shown in FIGS. 1 and 2 are inserted into a housing shown in FIG. 5 that has a base 14 and a cap 15. The transducer 11 is adjusted relative to a window 16 made in the cap 15 and is secured to the base 14. Abutting the window is a non-illustrated optical waveguide, which is joined to the housing by a coupling 20. The semiconductor component itself is electrically connected, through the metallizing 5 and the contact disposed on the upper surface of the semiconductor component, to two terminals 21 and 22, by way of which an operating voltage is supplied and the electrical signal is out-coupled, respectively.

Figure 3:
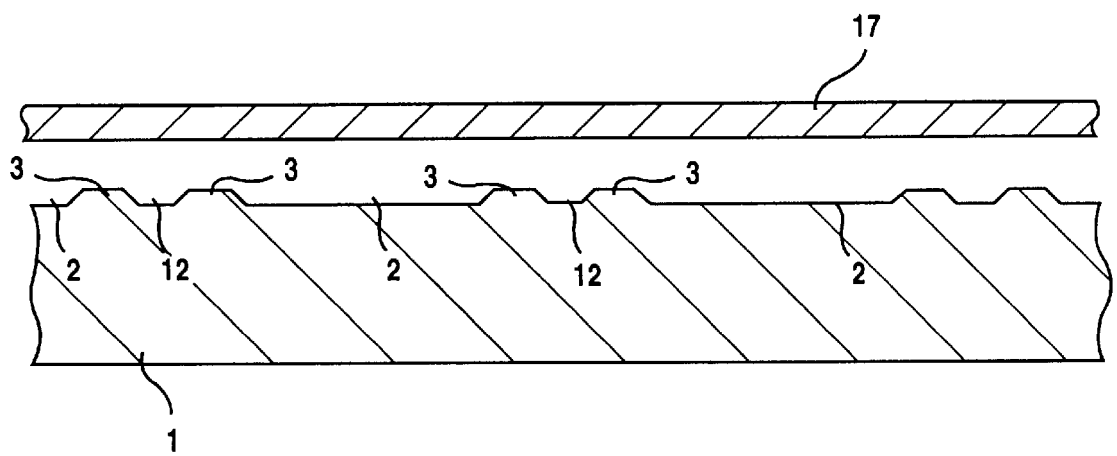
FIGS. 3 and 4 are fragmentary, longitudinal-sectional views showing characteristic steps in a production of an optoelectronic transducer.

In order to provide simultaneous production of a plurality of optoelectronic transducers 11 of FIGS. 1 or 2, a glass plate or silicon plate 1 is first provided with indentations 2 as shown in FIG. 3. These indentations serve to receive the semiconductor components and are dimensioned to be suitably wide. A ridge or land remains between each two of the indentations 2. These ridges or lands are suitably separated from one another by further indentations 12, creating ridges or lands 3. The indentations 2, 12 can be produced by photolithographic etching, for instance, or by sawing. Sawing produces ridges or lands 3 that are parallel to one another while in etching they can assume any arbitrary shape, such as a lattice shape.

Figure 4:
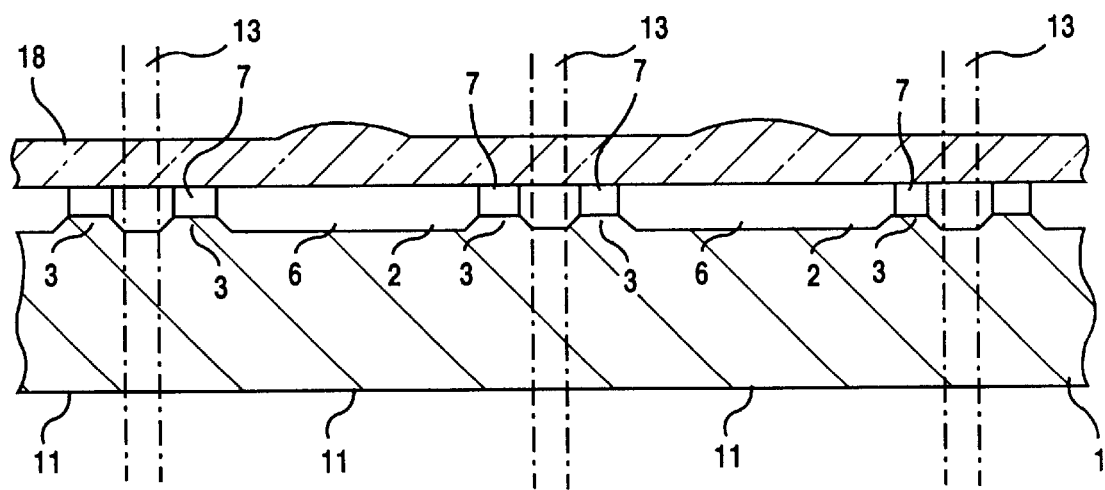

Next, a silicon or glass plate 17 is placed on the lands 3 and joined to the lands as described, by anodic bonding, adhesive bonding or soldering. Then the plate 17 is sawn apart in such a way that the material which is located between the lands or ridges 3 and is not joined to the base plate 1 is removed. This produces the spacers 7 shown in FIG. 4 which are joined to the lands or ridges 3. Next, the semiconductor components 6 are secured in the indentations 2 in accordance with a predetermined gridlike pattern.

A plate 18 of silicon or glass, containing a plurality of lens systems, is placed on the spacers 7 as the next step. The lens systems are disposed in a grid pattern on the plate 18 that matches the grid pattern of semiconductor components 6 secured on the base plate 1. The lens systems are aimed optically at the semiconductor components 6, and then the plate 18 is joined to the spacers 7 by the anodic bonding process described above or by soldering. This produces a composite, including the base plate 1, the semiconductor components 6, the spacers 7 and the plate 18, that has a plurality of semiconductor components and lens systems. This composite is then cut apart by sawing cuts 13 placed between the ridges or lands 3, and by further sawing cuts which are located perpendicular thereto and parallel to the plane of the drawing. Each of the units 11 thus produced is inserted, as described above, into a housing.

The technique of dividing up a wafer into small chips has been conventional in semiconductor technology for a long time and can also be employed to divide the composite. That is, the composite is divided by sawing, scoring and breaking. It is usual to fix the composite to an elastic adhesive foil. The foil then serves as a substrate in all of the subsequent processes.

In a modification of the method described above, it is also possible to first create the indentations 2 and the ridges or lands 3 photolithographically or mechanically, and then to attach the spacers as described. However, instead of a disk 18 provided with many lens systems, in that case individual lens systems are aimed optically at the semiconductor bodies and joined to the spacers 7.

We claim:

1. An optoelectronic transducer, comprising:

a base plate having a surface with lands formed thereon;

a radiation-emitting or transmitting semiconductor component disposed between said lands on said base plate and having a top surface;

an optical lens system aimed at said semiconductor component, an entire area of said top surface of said radiation-emitting or transmitting semiconductor component having a direct and unobstructed path to said optical lens system; and a spacer supported on said lands of said base plate for supporting said lens system;

said base plate, said spacer and said lens system being formed of materials with at least similar coefficients of thermal expansion.

2. The transducer according to claim 1, wherein said base plate and said lens system are formed of silicon and said spacer is formed of glass.

3. The transducer according to claim 1, wherein said base plate is formed of glass and said lens system and said spacer are formed of silicon.

4. The transducer according to claim 1, wherein said base plate has a metal layer on which said semiconductor component is secured.

5. The transducer according to claim 2, wherein said spacer formed of glass is joined to said base plate and said lens system formed of silicon, by anodic bonding.

6. The transducer according to claim 3, wherein said base plate formed of glass is joined to said lens system and said spacer formed of silicon, by anodic bonding.

7. The transducer according to claim 2, wherein said spacer formed of glass is joined to said base plate and said lens system formed of silicon by soldering.

8. The transducer according to claim 3, wherein said base plate formed of glass is joined to said lens system and said spacer formed of silicon by soldering.

9. The transducer according to claim 2, wherein said spacer formed of glass is joined to said base plate and said lens system formed of silicon by adhesive bonding.

10. The transducer according to claim 3, wherein said base plate formed of glass is joined to said lens system and said spacer formed of silicon by adhesive bonding.

11. The transducer according to claim 1, wherein said semiconductor component is seated in an indentation formed in said base plate.

12. The transducer according to claim 1, including a glass plate, said base plate being formed of silicon and having a side remote from said semiconductor component being joined to said glass plate.

13. The transducer according to claim 1, wherein said surface of said base plate has an indentation formed between said lands, and said semiconductor component is disposed in said indentation.

14. The transducer according to claim 1, wherein said base plate, said spacer and said lens system are entirely formed of materials with at least similar coefficients of thermal expansion.

15. An optoelectronic transducer system, comprising:

an optoelectronic transducer, including:

a base plate having a surface with lands formed thereon;

a radiation-emitting or transmitting semiconductor component disposed between said lands on said base plate;

an optical lens system aimed at said semiconductor component; and a spacer disposed on said lands and extending from said base plate and supporting said lens system, said spacer formed of glass with a given coefficient of thermal expansion and said base plate having a coefficient of thermal expansion substantially similar to said given coefficient of thermal expansion of said spacer.

16. The transducer system according to claim 15, including a housing having a base and a cap with a window, said optoelectronic transducer is secured to said base relative to said window of said cap, and a coupling disposed on said housing for receiving and securing a light wave conductor to said housing.

17. The transducer according to claim 16, wherein said transducer is adjustable relative to said window.

* * * * *